United States Patent [19]
Schultz

[11] Patent Number: 5,815,011
[45] Date of Patent: Sep. 29, 1998

[54] CIRCUIT FOR ADJUSTING THE CORING THRESHOLD OF A SIGNAL

[75] Inventor: Mark A. Schultz, Carmel, Ind.

[73] Assignee: SGS-Thomson Microelectronics S.A., Gentilly, France

[21] Appl. No.: 587,328

[22] Filed: Jan. 10, 1996

[30] Foreign Application Priority Data

Jan. 13, 1995 [FR] France ................................. 95 00604

[51] Int. Cl.⁶ .......................... H02N 5/217; H03K 17/16
[52] U.S. Cl. .............................. 327/89; 327/78; 327/170; 327/379; 348/623
[58] Field of Search ................................ 327/170, 179, 327/307, 78, 89, 482, 489, 563, 379; 330/252; 348/627, 623

[56] References Cited

U.S. PATENT DOCUMENTS

| | | | |
|---|---|---|---|
| 3,715,477 | 2/1973 | Olson et al. | 348/623 |
| 3,789,133 | 1/1974 | Kline | 348/627 |
| 3,940,708 | 2/1976 | Sumi et al. | 330/254 |
| 4,009,334 | 2/1977 | Sypula | 348/623 |
| 4,295,160 | 10/1981 | Lagoni . | |
| 4,408,133 | 10/1983 | Cooperman et al. | 327/89 |
| 4,437,123 | 3/1984 | Harlan . | |
| 4,520,396 | 5/1985 | Dischert et al. | 327/552 |
| 4,536,796 | 8/1985 | Harlan . | |
| 4,571,511 | 2/1986 | Dischert et al. . | |
| 4,899,221 | 2/1990 | Miller . | |
| 4,939,478 | 7/1990 | Heimsch et al. | 330/253 |
| 4,962,426 | 10/1990 | Naoi et al. | 348/623 |
| 4,984,074 | 1/1991 | Uomori et al. | 348/623 |
| 5,256,984 | 10/1993 | Lee | 330/261 |
| 5,299,008 | 3/1994 | Sadamatsu | 330/261 |
| 5,352,944 | 10/1994 | Sacchi et al. | 327/103 |
| 5,467,145 | 11/1995 | Limberg | 348/628 |
| 5,506,537 | 4/1996 | Kimura | 327/352 |

Primary Examiner—Timothy P. Callahan
Assistant Examiner—Terry L. Englund
Attorney, Agent, or Firm—David V. Carlson; Michael J. Donohue; Seed and Berry LLP

[57] ABSTRACT

A circuit provides an output signal having a portion with a constant maximum amplitude, followed by a portion decreasing down to a constant zero value when an input voltage increases from zero. The circuit includes an asymmetrical differential stage having a low gain branch and a high gain branch, respectively controlling two branches of a symmetrical differential stage. The current of the asymmetrical differential stage corresponds to the end of the decreasing portion. The current of the symmetrical differential stage corresponds to the maximum amplitude of the signal which is provided by one of the branches of the symmetrical differential stage. The high gain branch and low gain branch are respectively controlled by the input voltage and by a voltage corresponding to the beginning of the decreasing portion.

16 Claims, 4 Drawing Sheets

CIRCUIT FOR ADJUSTING THE CORING THRESHOLD OF A SIGNAL

TECHNICAL FIELD

The present invention relates to coring circuits that allow the transmission of a signal only if its amplitude exceeds a predetermined coring threshold, and more particularly to a circuit for adjusting the coring threshold as a function of the signal amplitude.

BACKGROUND OF THE INVENTION

A coring circuit is used in a peaking circuit that accentuates outlines of an object in a television picture. The coring circuit is used to avoid the detrimental peaking effects caused by the noise present in the low levels of the signal to be processed.

FIG. 1a represents a transfer characteristic of a conventional coring circuit. As long as the input signal $V_{in}$ of the circuit has in absolute value lower than a coring value Vc1, the coring circuit provides a zero output $V_{out}$. As soon as the value Vc1 is exceeded, the output $V_{out}$ varies as a function of signal $V_{in}$.

The characteristic of FIG. 1a corresponds to the characteristic obtained when the coring value Vc is constant as shown in FIG. 1b. In this case, FIG. 1a shows that the output $V_{out}$ corresponds to the portion of signal $V_{in}$ which exceeds value Vc1.

Some applications require that the transfer characteristic be similar to that represented in FIG. 2a. When signal $V_{in}$ exceeds a breakpoint value $V_b$, the coring value $V_c$ is decreased down to a zero value, so that the output $V_{out}$ reaches an exact copy of signal $V_{in}$ when the amplitude of the signal $V_{in}$ increases above an intercept value $V_{int}$.

For this purpose, the above-mentioned applications recommend a variable characteristic of the coring value Vc that is a function of the input signal $V_{in}$.

FIG. 2b illustrates this characteristic. Up to a breakpoint value $V_b$ of signal $V_{in}$, the coring value Vc is constant and equal to a limit value $V_{c1}$. From value $V_b$, the coring value Vc linearly decreases and reaches zero at an intercept value $V_{int}$ of signal $V_{in}$.

The limit value $V_{c1}$ should be selectable between 0 and 7% of the maximum amplitude of signal $V_{in}$, the intercept value $V_{int}$ should be selectable between 45 and 85% of the maximum value of signal $V_{in}$, and the breakpoint value $V_b$ should be selectable between 0 and value $V_{int}$. Thus, the characteristic curve of FIG. 2b may have several forms depending upon the values $V_{c1}$, $V_b$, and $V_{int}$. FIG. 2b represents two exemplary forms, one drawn in solid lines and the other in dash lines.

SUMMARY OF THE INVENTION

An object of the present invention is to provide a particularly simple circuit for achieving the characteristic of FIG. 2b.

To achieve this object, the present invention provides a circuit including an asymmetrical differential stage having a low gain branch and a high gain branch. The low gain branch is controlled by the input voltage and supplies a first load. The high gain branch supplies a second load of the same nature as the first load and is controlled by a voltage which corresponds to the beginning of the decreasing portion. A first current source establishes the current of the asymmetrical differential stage. This current corresponds to the end of the decreasing portion. A symmetrical differential stage has a first branch controlled by the low gain branch and provides the output signal of the circuit. A second branch of the symmetrical differential stage is controlled by the high gain branch. The current of the symmetrical differential stage is established at a value which corresponds to the maximum amplitude of the output signal.

According to an embodiment of the invention, the asymmetrical differential stage comprises first and second transistors. The first transistor, associated with the high gain branch, is connected between the second load and the first current source. The second transistor, associated with the low gain branch, is connected to the first current source through a resistor and is connected to the first load.

According to another embodiment of the invention, the first and second loads are diodes and the symmetrical differential stage includes two transistors that are symmetrically connected to a second current source which establishes the current of the symmetrical differential stage.

BRIEF DESCRIPTION OF DRAWINGS

The foregoing and other objects, features, aspects and advantages of the invention will become apparent from the following detailed description of the present invention when taken in conjunction with the accompanying drawings.

DETAILED DESCRIPTION OF THE INVENTION

Figure 1A:
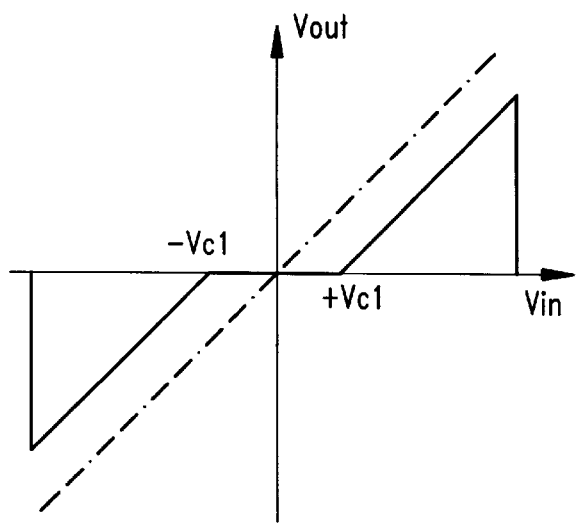
FIG. 1a shows a transfer characteristic of a coring circuit.
Figure 1B:
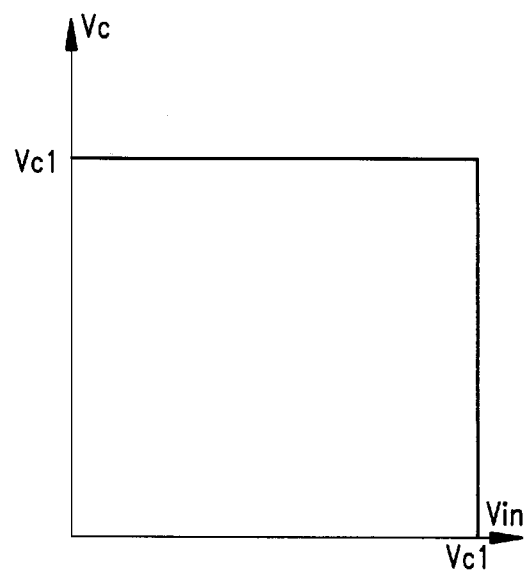
FIG. 1b shows a characteristic of a constant coring value.
Figure 2A:
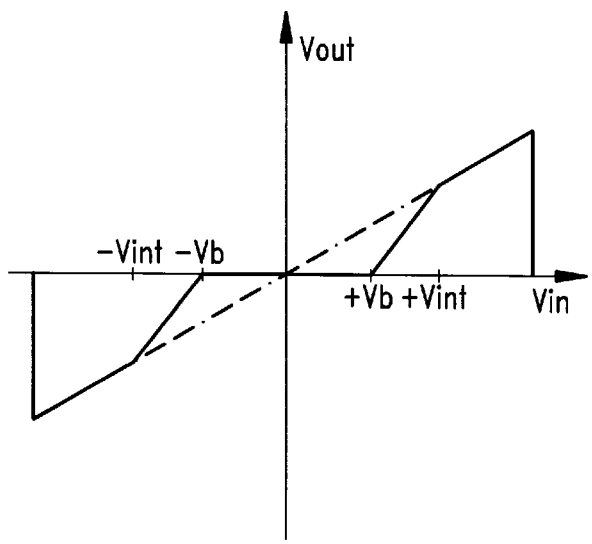
FIG. 2a shows a transfer characteristic of a coring circuit recommended by present applications in the television field.
Figure 2B:
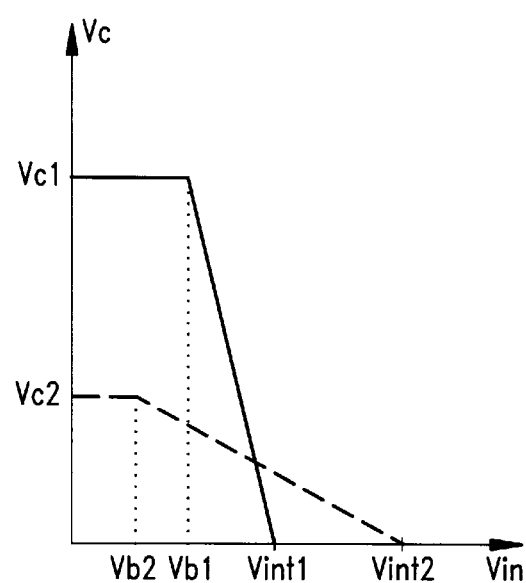
FIG. 2b shows a characteristic of the variation of the coring value, recommended by present applications in the television field.
Figure 3:
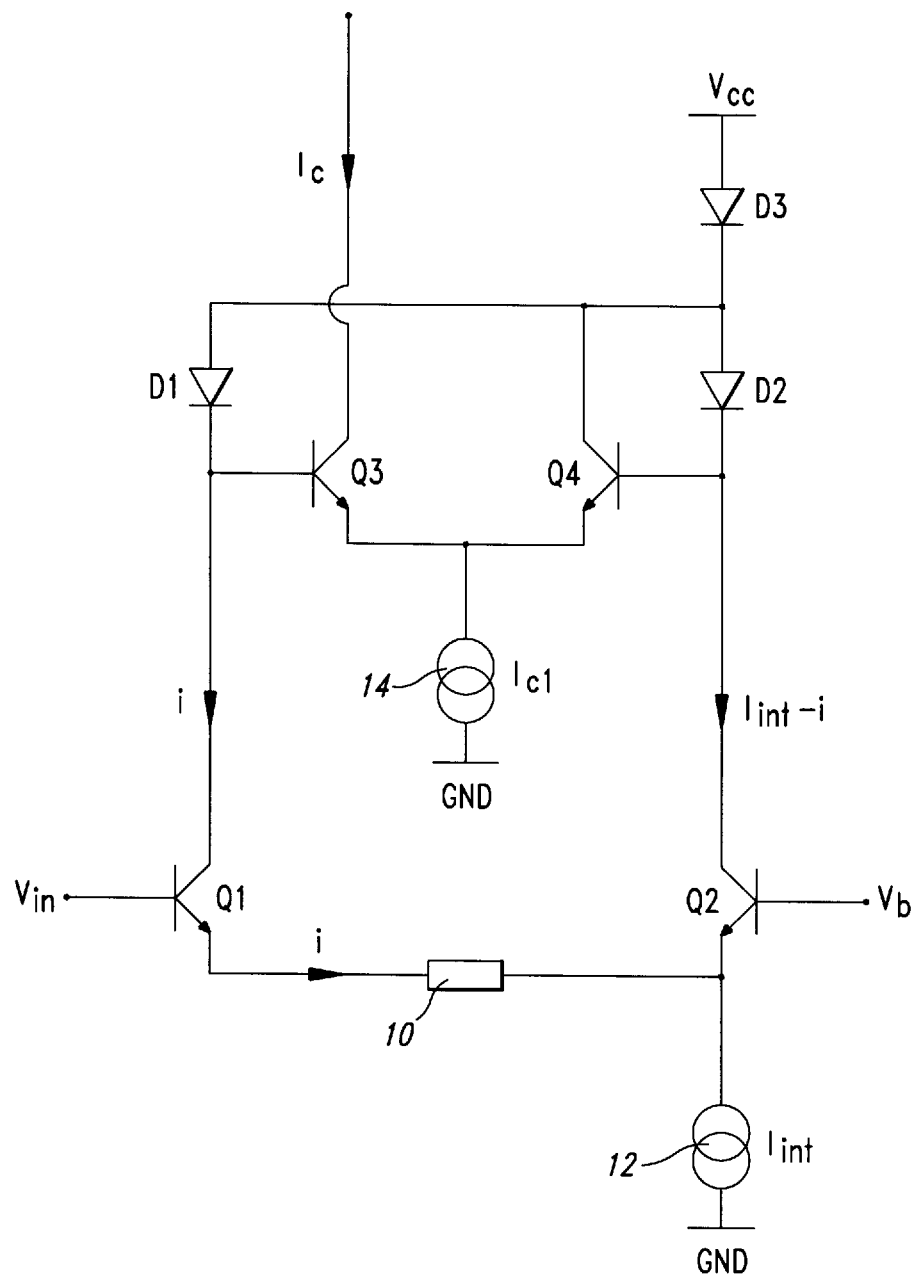
FIG. 3 shows an embodiment of a circuit according to the invention for achieving the characteristic of FIG. 2b.

FIG. 3 shows a circuit providing a current Ic which can control any conventional coring circuit, either directly, or after a current to voltage conversion, for fixing the coring value Vc (FIGS. 2a and 2b). The conventional coring circuit, not involved in the present invention, is not described.

The input signal of the coring circuit, voltage $V_{in}$, is applied on the base of an NPN transistor Q1 which forms with a transistor Q2 an asymmetrical differential stage. The emitter of transistor Q2 is connected to the emitter of transistor Q1 through a resistor 10 and to a low supply voltage GND through a current source 12 providing a current $I_{int}$ which corresponds to the intercept value $V_{int}$ of the characteristic of FIGS. 2a and 2b.

The collectors of transistors Q1 and Q2 are connected respectively to the bases of two NPN transistors Q3 and Q4, that form a symmetrical differential stage. The emitters of transistors Q3 and Q4 are connected to voltage GND through a current source 14 providing a current $I_{c1}$ which corresponds to the limit value $V_{c1}$ to the characteristic of FIG. 2b. The collector of transistor Q3 provides the current Ic which corresponds to the coring value Vc. The current Ic may be converted into a voltage or mirrored by a current mirror (not shown) to be restored with suitable polarity and gain.

Values $I_{int}$, $V_b$, and $I_{c1}$ are provided by independent sources which allow a free control of each particular point of the characteristic of FIG. 2b.

The bases of transistors Q3 and Q4 are connected to the collector of transistor Q4 through two biased diodes D1 and D2, respectively. The collector of transistor Q4 is further connected to a high supply voltage Vcc through a biased diode D3. In one embodiment, diodes D1, D2 and D3 are formed by, for example, NPN transistors, each of which has its base connected to its own collector. In another embodiment, diodes D1, D2, and D3 are stand-alone, discrete component diodes.

When voltage $V_{in}$ is lower than voltage $V_b$, no current flows in resistor 10. All current $I_{int}$ of source 12 flows in transistor Q2 and diode D2. Diode D1 is biased only by the base current of transistor Q3. Since the current in diode D1 is substantially lower than the current in diode D2, the base voltage of transistor Q3 is significantly higher than the base voltage of transistor Q4. As a result, transistor Q3 derives all current $I_{c1}$ of source 14.

The circuit of FIG. 3 is maintained in this state independently of the voltage $V_{in}$ when $V_{in}$ is lower than voltage $V_b$. This provides the horizontal portion of the characteristic of FIG. 2b which corresponds to a constant current Ic, equal to the limit value $I_{c1}$.

When voltage $V_{in}$ exceeds voltage $V_b$, a current i equal to $(V_{in}-V_b)/R$ is established in resistor 10, where R is the value of resistor 10. Then, current i flows through diode D1 and a current $I_{int}$-i flows through diode D2. The current in diode D1 increases whereas the current in diode D2 decreases. As a consequence, the base voltage of transistor Q3 decreases whereas the base voltage of transistor Q4 increases. An increasing portion of current $I_{c1}$ of source 14 then flows through transistor Q4, which decreases current Ic.

When voltage $V_{in}$ is high enough for all current $I_{int}$ of source 12 to flow through transistor Q1, diode D1 conducts a current $I_{int}$, whereas diode D2 conducts only the bias current of transistor Q4. Transistor Q4 derives all current $I_{c1}$ of source 14, and current Ic is zero, even though voltage $V_{in}$ continues to increase.

The connection of the differential stage Q3, Q4 and diodes D1 and D2 provides a linear transition between the moment when the collector current of transistor Q1 becomes zero for $V_{in}=V_b$, and the moment when the collector current of transistor Q2 becomes zero for $V_{in}=V_b+RI_{int}$. Thus, the circuit of FIG. 3 provides the linearly decreasing, then the zero, portions of the characteristic of FIG. 2b.

In an alternative embodiment, diodes D1 and D2 could be replaced by resistors. However, it is then more difficult to determine the transitions between the moments when only one of the transistors Q3 and Q4 is conductive and when both transistors Q3 and Q4 are conductive, i.e., the values $V_b$ and $V_{int}$ which determine the beginning and the end of the decreasing portion of the characteristic of FIG. 2b.

Diode D3 is optional. It is used to increase the power supply rejection ratio and to decrease the base voltages of transistors Q3 and Q4, so that the collector of transistor Q3 can, if necessary, control the input of a current mirror connected to voltage Vcc, without transistor Q3 saturating.

As is apparent to those skilled in the art, various modifications can be made to the above disclosed preferred embodiments. For example, diodes D1 and D2 can be replaced by resistors or other resistance elements and the differential stage Q3, Q4 can be accordingly adapted to establish the decreasing portion of the characteristic. Further, transistors Q1–Q4 can be implemented using MOS, CMOS, or BICMOS technology.

Figure 4:
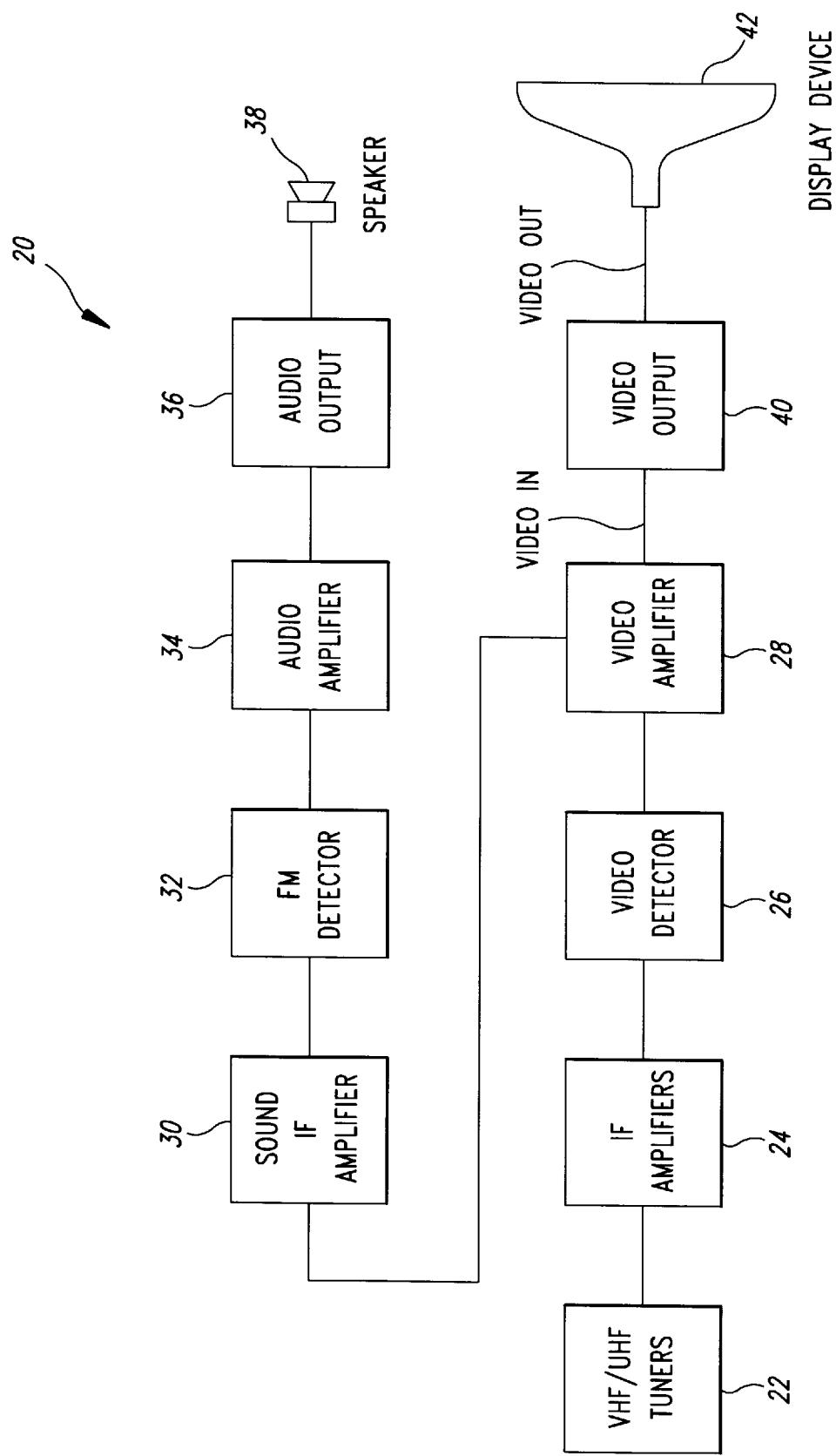
FIG. 4 shows a block diagram of a television set according to the present invention.

As will be appreciated by those skilled in the art, a video unit such as a television set can include a circuit according to the present invention. FIG. 4 shows a block diagram of a television set 20 that includes VHF/UHF tuners 22, intermediate frequency (IF) amplifiers 24, a video detector 26, and a video amplifier 28. Television set 20 also includes a sound IF amplifier 30, a frequency modulation (FM) detector 32, an audio amplifier 34, an audio output circuit 36, and a speaker 38. FIG. 4 also shows a video output circuit 40 for receiving a signal VIDEO IN from the video amplifier 28 in the form of luminance (Y) and chrominance (U, V) signals, and for providing a signal VIDEO OUT to a display device 42, such as a cathode ray tube or a flat panel display. With the exception of the video amplifier 28, the above circuits are well known; they may be provided by known conventional circuits, many of which are acceptable.

Figure 5:
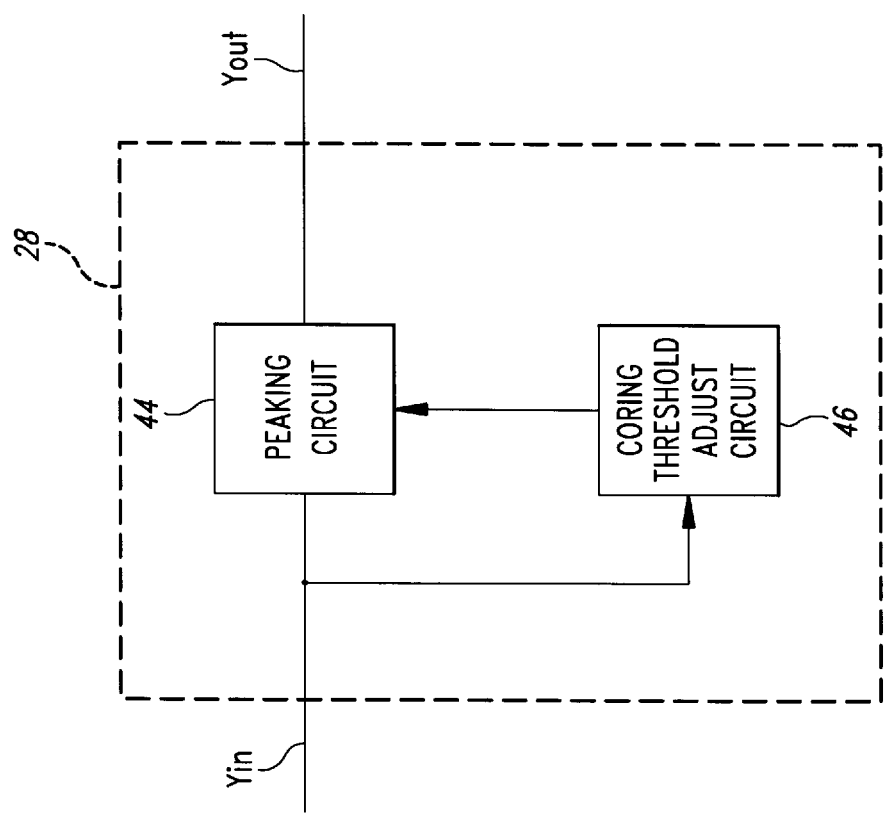
FIG. 5 shows a detail of the block diagram of FIG. 4.

FIG. 5 shows that according to the present invention, the video amplifier 28 includes a peaking a circuit 44 and a coring threshold adjust circuit 46 which usually act on the luminance signal $Y_{in}$ of the video signal. The peaking circuit 44 receives the luminance signal $Y_{in}$ and accentuates outlines of objects displayed on the display device 42. The peaking circuit 44 includes a conventional coring circuit (not shown) for transmitting as a signal $Y_{out}$ the portions of signal $Y_{in}$ with an amplitude greater than a coring threshold. According to the present invention, the video amplifier 28 also includes a coring threshold adjust circuit 46 for adjusting the coring threshold as a function of the amplitude of signal $Y_{in}$. FIG. 3 shows an example of the coring threshold adjust circuit 46.

The coring threshold adjust circuit 46 adjusts the coring threshold such that the coring threshold has a first coring threshold level when the amplitude of the signal $Y_{in}$ is less than or equal to the first voltage level. The coring threshold has a second coring threshold level when the amplitude of the signal $Y_{in}$ is greater than or equal to a second voltage level; the second voltage level is greater than the first voltage level. The coring threshold has a third coring threshold level between the first and second coring threshold levels when the amplitude of the signal $Y_{in}$ is between the first and second voltage levels. Further, the third coring threshold level varies substantially linearly as the amplitude of the signal $Y_{in}$ varies between the first and second voltage levels.

As will be appreciated, a first alternative embodiment of television set 20 can represent an audio/video monitor. This first alternative embodiment includes the video amplifier 28, the audio amplifier 34, the audio output circuit 36, the speaker 38, the video output circuit 40, and the display device 42. The video amplifier 28 includes a coring threshold adjust circuit 46 as described above. The VHF/UHF tuners 22, the IF amplifiers 24, the video detector 26, the sound IF amplifier 30, and the FM detector 32 are optional and are not necessary in the first alternative embodiment.

In a second alternative embodiment, television set 20 can represent a video monitor. This second alternative embodiment includes the video amplifier 28, the video output circuit 40, and the display device 42. The video amplifier 28 includes a coring threshold adjust circuit 46 as described above. The audio amplifier 34, the audio output circuit 36, the speaker 38, and the optional components of the audio/video monitor described above are optional and are not necessary in the second alternative embodiment.

Even though the invention has been described with relation to a coring circuit, it applies to any case in which it is required to provide a signal having a constant maximum amplitude, followed by a portion decreasing down to a zero constant value when an input signal increases from zero. Further, because of the ease of implementation as will be appreciated by those skilled in the art, a circuit according to the invention can easily be integrated on a semiconductor substrate.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

I claim:

1. A circuit for providing an output signal having a portion with a constant maximum amplitude followed by a decreasing portion decreasing down to a constant zero value when an input voltage increases from zero, the circuit comprising:

an asymmetrical differential stage having first and second branches respectively controlled by the input voltage and a breakpoint voltage corresponding to a beginning of the decreasing portion, and being connected such that all the current of said asymmetrical differential stage flows in said second branch of said asymmetrical differential stage when the input voltage is below said breakpoint voltage and progressively flows into said first branch of said asymmetrical differential stage when the input voltage increases above said breakpoint voltage;

a first current source which establishes the current of said asymmetrical differential stage, the current corresponding to an end of the decreasing portion;

a symmetrical differential stage having a first branch controlled by said first branch of said asymmetrical differential stage and providing the output signal, said symmetrical differential stage having a second branch controlled by said second branch of said asymmetrical differential stage; and means for establishing a current of the symmetrical differential stage at a value corresponding to the maximum amplitude.

2. The circuit of claim 1 wherein said asymmetrical differential stage comprises:

first and second transistors, said first transistor being associated with said second branch of said asymmetrical differential stage and being connected between a first load and said first current source, said second transistor being associated with said first branch of said asymmetrical differential stage and being connected to said first current source through a resistor and being connected to a second load.

3. The circuit of claim 2 wherein said first and second loads each comprise a diode and wherein said symmetrical differential stage comprises third and fourth transistors symmetrically connected to said means for establishing a current, said means including a second current source which establishes the current of the symmetrical differential stage.

4. The circuit of claim 2 wherein said first and second transistors each comprise a bipolar transistor.

5. The circuit of claim 3 wherein said third and fourth transistors each comprise a bipolar transistor.

6. The circuit of claim 2 wherein said first and second transistors each comprise a MOS transistor.

7. The circuit of claim 3 wherein said third and fourth transistors each comprise a MOS transistor.

8. A circuit comprising:

a first current generator for generating a first current having a first current level;

a first differential circuit coupled to receive the first current, said first differential circuit having a first control terminal coupled to receive an input voltage and a second control terminal coupled to receive a first voltage having a first voltage level, said first differential circuit generating first and second control signals in response to a difference between the input voltage and the first voltage, said first and second control signals having first and second fixed signal levels, respectively, when the input voltage is less than the first voltage with said second signal level corresponding to said first current, said first and second control signals varying inversely with respect to each other when the input voltage increases above the first voltage until said first and second control signals are at said second and first signal levels, respectively;

a second current generator for generating a second current having a second current level;

a second differential circuit coupled to receive the second current and having a first control terminal coupled to receive said first control signal from said first differential circuit and a second control terminal coupled to receive said second control signal from said first differential circuit; and an output terminal coupled to receive an output signal from said second differential circuit, the output signal having a first output level that corresponds to the first current level when the input voltage is less than or equal to the first voltage level, the output signal having a second output level when the input voltage is greater than or equal to a second voltage level that is greater than the first voltage level, the output signal varying in a linear fashion with respect to the input voltage when the input voltage is between the first and second voltage levels.

9. The circuit of claim 8 wherein the second output level is substantially zero.

10. The circuit of claim 8 wherein the first control signal is substantially zero and the second control signal is substantially the first current when the input voltage is less than or equal to the first voltage level.

11. The circuit of claim 8 wherein the first control signal is substantially the first current and the second control signal is substantially zero when the input voltage is greater than or equal to the second voltage level.

12. The circuit of claim 8, further comprising:

a supply voltage terminal coupled to receive a supply voltage;

a first load device coupled between the first control terminal of said second differential circuit and said supply voltage terminal; and a second load device coupled between the second control terminal of said second differential circuit and said supply voltage terminal.

13. The circuit of claim 12, further comprising:

a third load device coupled between said first and second load devices and said supply voltage terminal.

14. The circuit of claim 13 wherein said first, second, and third load devices each comprise a diode.

15. The circuit of claim 13 wherein said first, second, and third load devices each comprise a diode connected transistor.

16. The circuit of claim 8, integrated on a substrate of semiconductor material.

* * * * *